US011459414B2

(12) United States Patent
Umezaki et al.

(10) Patent No.: US 11,459,414 B2
(45) Date of Patent: Oct. 4, 2022

(54) FILM FORMING COMPOSITION CONTAINING FLUORINE-CONTAINING SURFACTANT

(71) Applicant: NISSAN CHEMICAL INDUSTRIES, LTD., Tokyo (JP)

(72) Inventors: Makiko Umezaki, Toyama (JP); Ryo Karasawa, Toyama (JP); Shuhei Shigaki, Toyama (JP); Ryuta Mizuochi, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 17/126,280

(22) Filed: Dec. 18, 2020

(65) Prior Publication Data

US 2021/0102088 A1 Apr. 8, 2021

Related U.S. Application Data

(62) Division of application No. 15/116,550, filed as application No. PCT/JP2015/052703 on Jan. 30, 2015.

(30) Foreign Application Priority Data

Feb. 12, 2014 (JP) ................................ 2014-024323

(51) Int. Cl.
| | |
|---|---|
| H01L 21/311 | (2006.01) |
| H01L 21/027 | (2006.01) |
| C09D 133/12 | (2006.01) |
| C08F 220/14 | (2006.01) |
| G03F 7/11 | (2006.01) |
| C08L 33/14 | (2006.01) |
| G03F 7/09 | (2006.01) |
| G03F 7/075 | (2006.01) |
| G03F 7/16 | (2006.01) |
| G03F 7/20 | (2006.01) |
| G03F 7/30 | (2006.01) |
| C08L 101/04 | (2006.01) |
| C08L 101/00 | (2006.01) |

(52) U.S. Cl.
CPC .......... *C08F 220/14* (2013.01); *C08L 33/14* (2013.01); *C09D 133/12* (2013.01); *G03F 7/0752* (2013.01); *G03F 7/094* (2013.01); *G03F 7/11* (2013.01); *G03F 7/16* (2013.01); *G03F 7/20* (2013.01); *G03F 7/30* (2013.01); *H01L 21/0276* (2013.01); *C08L 101/00* (2013.01); *C08L 101/04* (2013.01)

(58) Field of Classification Search
None
See application file for complete search history.

(56) References Cited

U.S. PATENT DOCUMENTS

| | | | |
|---|---|---|---|
| 5,091,214 A | 2/1992 | Muller et al. | |
| 5,141,783 A | 8/1992 | Corsi et al. | |
| 5,597,868 A | 1/1997 | Kunz | |
| 6,410,677 B1 * | 6/2002 | Enoki | .................... C08G 73/10 528/170 |
| 2003/0224281 A1 | 12/2003 | Ishizuka et al. | |
| 2006/0181774 A1 | 8/2006 | Ojima et al. | |
| 2007/0042290 A1 | 2/2007 | Inabe et al. | |
| 2009/0041984 A1 | 2/2009 | Mayers et al. | |
| 2010/0092892 A1 | 4/2010 | Kurita et al. | |
| 2010/0151381 A1 | 6/2010 | Tachibana et al. | |
| 2010/0178617 A1 | 7/2010 | Hatakeyama et al. | |
| 2011/0262862 A1 | 10/2011 | Ohashi et al. | |
| 2012/0009527 A1 | 1/2012 | Hatakeyama et al. | |
| 2012/0127580 A1 | 5/2012 | Okamoto | |
| 2013/0122285 A1 | 5/2013 | Kawasaki et al. | |
| 2014/0038102 A1 * | 2/2014 | Park | ......................... G03F 7/20 430/270.1 |
| 2017/0003418 A1 | 1/2017 | Yamamoto et al. | |

FOREIGN PATENT DOCUMENTS

| | | |
|---|---|---|
| EP | 2192134 A1 | 6/2010 |
| EP | 2469338 A1 | 6/2012 |
| JP | 9-506185 A | 6/1997 |

(Continued)

OTHER PUBLICATIONS

Apr. 9, 2021 Office Action issued in U.S. Appl. No. 15/116,550.
Mar. 24, 2015 Written Opinion issued in Intenational Patent Application No. PCT/JP2015/052703.
Mar. 24, 2015 Search Report issued in International Patent Application No. PCT/JP2015/052703.
Sep. 1, 2017 Extended Search Report issued in European Patent Application No. 15749601.9.
Mar. 9, 2018 Second Written Opinion issued in Singapore Application No. 11201606648Q.
Dec. 7, 2021 Office Action Issued In U.S. Appl. No. 15/116,550.

*Primary Examiner* — Shamim Ahmed
(74) *Attorney, Agent, or Firm* — Oliff PLC

(57) ABSTRACT

Methods for forming a film with reduced formation of an edge reservoir at a periphery of a film in which the edge reservoir causes an unnecessary residue that cannot be removed by an etching process. A film forming composition for use in a lithography process includes a surfactant containing a polymer and an oligomer having a $C_{3-5}$ perfluoroalkyl partial structure. The perfluoroalkyl partial structure may further include an alkyl partial structure. The surfactant is contained in an amount of 0.0001% by mass to 1.5% by mass based on the total solid content of the film forming composition. The film forming composition further includes a coating film resin, the coating film resin is a novolac resin, a condensation epoxy resin, a (meth)acrylic resin, a polyether-based resin, or a silicon-containing resin, etc. The formed film can be used as a resist underlayer film or a resist overlayer film.

9 Claims, No Drawings

(56) References Cited

FOREIGN PATENT DOCUMENTS

| | | | |
|---|---|---|---|
| JP | 2001-217184 A | 8/2001 | |
| JP | 2004-031569 * | 1/2004 | ........... H01L 21/027 |
| JP | 2004-031569 A | 1/2004 | |
| JP | 2009-169230 A | 7/2009 | |
| JP | 2010-107957 A | 5/2010 | |
| JP | 2012-068374 A | 4/2012 | |
| JP | 2013-242555 A | 12/2013 | |
| JP | 2014-079960 A | 5/2014 | |
| WO | 2006/059555 A1 | 6/2006 | |
| WO | 2009/096340 A1 | 8/2009 | |
| WO | 2014/109186 A1 | 7/2014 | |

* cited by examiner

FILM FORMING COMPOSITION CONTAINING FLUORINE-CONTAINING SURFACTANT

This is a Division of application Ser. No. 15/116,550 filed Aug. 4, 2016, which is a National Phase of International Application No. PCT/JP2015/052703 filed Jan. 30, 2015, which claims the benefit of Japanese Application No. 2014-024323 filed Feb. 12, 2014. The disclosures of the prior applications are hereby incorporated by reference herein in their entireties.

TECHNICAL FIELD

The present invention relates to a film forming composition for use in a lithography process and a method for manufacturing a semiconductor device using the film forming composition.

BACKGROUND ART

Along with the recent development in high integration of a semiconductor device, active rays to be used in a lithography process tend to have a shorter wavelength, from a KrF excimer laser (wavelength: 248 nm) to an ArF excimer laser (wavelength: 193 nm) and EUV (extreme ultraviolet, wavelength: 13.5 nm), and an electron beam exposure technology tends to be used. For films (coating films) formed of a film forming composition to be used in the lithography process, there has been tendency that materials suitable for the exposure have been increasingly used. As described in Patent Document 1, for example, those films are formed by the following process. Namely, a film forming composition is applied by spin-coating on a semiconductor substrate to form a coating film, and then, in order to remove an unnecessary portion of the coating film bulging on an outer periphery of the semiconductor substrate, a substrate edge portion is cleaned (edge rinse) using an organic solvent. Subsequently, the coating film is baked to form a film. Then, a photoresist film is formed on the film, and a pattern is formed on the substrate through processes such as exposure and development.

Since the coating film is shrunk by the organic solvent for cleaning during the edge rinse described above, an edge reservoir is formed at a periphery of the coating film, and it is known that the edge reservoir causes an unnecessary residue generated on the semiconductor substrate. Namely, although an unnecessary coating film portion at the substrate edge portion is dissolved and removed by the organic solvent used in the edge rinse, a portion of the coating film inside thereof is shrunk by surface tension to form a rising portion at an edge portion of the coating film, and, thus, to form the edge reservoir. In the film forming composition after coating, since the flowability is lowered by evaporation of the solvent, the edge reservoir remains without being removed. If the coating film is baked in a state in which there is the edge reservoir, the edge reservoir affects the film, and the film having the edge reservoir is formed. The height of the edge reservoir of the film thus formed may be not less than 10 times the thickness of the film at a substrate center portion. There has been a problem in that the edge reservoir of the film causes an unnecessary residue that cannot be removed even by an etching process to be generated on a semiconductor substrate. In order to solve such a problem, methods of removing the edge reservoir have been considered. For example, Patent Document 2 describes a method using a composition containing a fluorine-containing surfactant component in order to remove the edge reservoir.

PRIOR ART DOCUMENTS

Patent Documents

Patent Document 1: Japanese Patent Application Publication No. 2001-217184 (JP 2001-217184 A)
Patent Document 2: Japanese Patent Application Publication No. 2004-031569 (JP 2004-031569 A)

SUMMARY OF THE INVENTION

Problem to be Solved by the Invention

However, the less amount of a surfactant contained in a film forming composition, the more preferable. This is because additional components tend to become unwanted sublimate components in a film heating process and may cause formation of defects on a substrate.

In view of the above circumstances, an object of the present invention is to provide a method for forming a film used in a lithography process in the manufacture of a semiconductor device. In particular, an object of the present invention is to provide a film with reduced formation of an edge reservoir at a periphery of a film in which the edge reservoir causes an unnecessary residue that cannot be removed by an etching process, and a method for forming the film.

Means for Solving the Problem

The present invention provides, as a first aspect, a film forming composition for use in a lithography process, the film forming composition characterized by comprising a surfactant containing a polymer and an oligomer having a $C_{3-5}$ perfluoroalkyl partial structure, as a second aspect, the film forming composition as described in the first aspect, in which the perfluoroalkyl partial structure has a carbon number of 4, as a third aspect, the film forming composition as described in the first or second aspect, in which the perfluoroalkyl partial structure may further include an alkyl partial structure, as a fourth aspect, the film forming composition as described in any one of the first to third aspects, in which the polymer and the oligomer are a (meth)acrylate polymer and a (meth)acrylate oligomer, respectively, as a fifth aspect, the film forming composition as described in any one of the first to fourth aspects, in which the surfactant is contained in an amount of 0.0001% by mass to 1.5% by mass based on the total solid content of the film forming composition, as a sixth aspect, the film forming composition as described in any one of the first to fifth aspects, further comprising a coating film resin.

as a seventh aspect, the film forming composition as described in the sixth aspect, in which the coating film resin is a novolac resin, a condensation epoxy resin, a (meth)acylic resin, a polyether-based resin, or a silicon-containing resin, as an eighth aspect, the film forming composition as described in any one of the first to seventh aspects, in which a film is a resist underlayer film or a resist overlayer film, as a ninth aspect, a method for manufacturing a semiconductor device, the method comprising a process of forming an underlayer film on a semiconductor substrate by use of the film forming composition as described in any one of the first to eighth aspects, a process of forming a resist film on the underlayer film, a process of forming a resist pattern by irradiation with light, EUV, or an electron beam and development, a process of etching the underlayer film by use of the formed resist pattern, and a process of processing the semiconductor substrate by use of the patterned underlayer film, as a tenth aspect, a method for manufacturing a semiconductor device, the method comprising a process of forming an underlayer film on a semiconductor substrate by use of the film forming composition as described in any one of the first to eighth aspects, a process of forming a hard mask on the underlayer film, a process of further forming a resist film on the hard mask, a process of forming a resist pattern by irradiation with light, EUV, or an electron beam and development, a process of etching the hard mask by use of the formed resist pattern, a process of etching the underlayer film by use of the patterned hard mask, and a process of processing the semiconductor substrate by use of the patterned underlayer film, as an eleventh aspect, a method for manufacturing a semiconductor device, the method comprising a process of forming an organic underlayer film on a semiconductor substrate, a process of applying the film forming composition as described in any one of the first to eighth aspects onto the organic underlayer film and baking the composition to form a resist underlayer film, a process of applying a composition for a resist on the resist underlayer film to form a resist film, a process of exposing the resist film with light, EUV, or an electron beam, a process of developing the resist film after exposure to obtain a resist pattern, a process of etching the resist underlayer film by use of the resist pattern, a process of etching the organic underlayer film by use of the patterned resist underlayer film, and a process of processing the semiconductor substrate by use of the patterned organic underlayer film, and as a twelfth aspect, a method for manufacturing a semiconductor device, the method comprising a process of forming a resist film on a semiconductor substrate, a process of applying the film forming composition as described in any one of the first to eighth aspects onto the resist film and baking the composition to form a resist overlayer film, a process of exposing the semiconductor substrate, covered with the resist overlayer film and the resist film, with light, EUV, or an electron beam, and a process of performing development after exposure to remove the resist overlayer film and the resist film.

Effects of the Invention

The present invention can provide a method for forming a film in which an edge reservoir formed at a periphery of the film is reduced. In the present invention, a film forming composition containing a fluorine-containing surfactant component is applied onto a semiconductor substrate to form a film (coating film), the coating film at a substrate edge portion is removed by a solvent, and, after that, the substrate having the film (coating film) is heated (baked), whereby a film can be formed.

In the present invention, even if an amount of a surfactant contained in the film forming composition is smaller than an amount of a similar surfactant having been added by a conventional method, the same effect as above is provided. Since a content of surfactants in a film can be reduced, it is considered that an amount of substances scattered as sublimates during heating of a film is reduced, and defects on a substrate originating from causes such as dropping of a sublimate adhering inside a draft chamber can be reduced.

MODES FOR CARRYING OUT THE INVENTION

The present invention provides a film forming composition for use in a lithography process. The film forming composition is characterized by comprising a surfactant containing polymers and oligomers having a $C_{3-5}$ perfluoroalkyl partial structure.

The polymers and oligomers may contain a compound having a weight average molecular weight of approximately 300 to 100,000.

Here, although a boundary between polymers and oligomers is not clear, it is considered that an oligomer component more effectively acts in terms of solubility in a composition.

It is preferable that the carbon number of the perfluoroalkyl partial structure is 4.

The perfluoroalkyl partial structure may further include an alkyl partial structure and may contain a perfluoroalkyl group at its end. The perfluoroalkyl group portion is bonded to a polymer and an oligomer through an alkylene group (alkyl partial structure), and the entire compound may contain a fluoroalkyl group.

That is, the surfactant is a fluorine-containing surfactant, and the surfactant component thereof is a polymer and an oligomer having a $C_{3-5}$ perfluoroalkyl partial structure.

Examples of the $C_{3-5}$ perfluoroalkyl partial structure include a perfluoropropyl partial structure having a carbon number of 3, a perfluorobutyl partial structure having a carbon number of 4, and a perfluoropentyl partial structure having a carbon number of 5, and it is preferable to have the perfluorobutyl partial structure having a carbon number of 4.

It is preferable that those perfluoroalkyl partial structures exist at the end of the polymer and the oligomer.

The polymer and the oligomer constituting the surfactant are preferably a (meth)acrylate polymer and a (meth)acrylate oligomer, respectively. Examples of the polymer and the oligomer include a polymer and an oligomer formed by homopolymerization of the monomer units having a fluorine atom in the side chain and a polymer and an oligomer formed by copolymerization of the monomer units having a fluorine atom in the side chain and the monomer units having a hydrophilic moiety, such as hydroxy group and carboxy group, in the side chain.

As the monomer units having a fluorine atom in the side chain, examples of the monomer units having a perfluoropropyl partial structure include heptafluoropropyl acrylate, heptafluoropropyl methacrylate, heptafluoropentyl acrylate, and heptafluoropentyl methacrylate. Examples of the monomer units having a perfluorobutyl partial structure include nonafluorobutyl acrylate, nonafluorobutyl methacrylate, nonafluorohexyl acrylate, and nonafluorohexyl methacrylate. Examples of the monomer units having a perfluoropentyl partial structure include undecafluoropentyl acrylate, undecafluoropentyl methacrylate, undecafluoroheptyl acrylate, and undecafluoroheptyl methacrylate.

Examples of a monomer having a hydrophilic moiety in the side chain include compounds having an addition polymerizable unsaturated bond, such as (meth)acrylic acids, (meth)acrylic esters having a hydroxy group in an ester moiety, such as 2-hydroxypropyl methacrylate, hydroxybutyl methacrylate, and hydroxypentyl methacrylate, vinyl ethers having a hydroxy group, such as 2-hydroxyethyl vinyl ether, vinyl alcohols, and vinylphenols.

Among them, preferred are a fluorine-containing (meth)acrylate polymer and a fluorine-containing (meth)acrylate oligomer obtained by addition polymerization of the monomer units having a fluorine atom in the side chain and the monomer units having hydroxy group in the side chain.

Examples of these include commercially available fluorine-containing surfactants such as MEGAFACE R-40 and R-40LM (trade names) manufactured by DIC Corporation.

One of the fluorine-containing surfactant components or a mixture of two or more kinds of them may be used. The fluorine-containing surfactant is contained in an amount of 0.0001% by mass to 1.5% by mass and preferably 0.0005 to 1.0% by mass based on the mass of the total solid content of a film forming composition.

Other components of the film forming composition for use in the present invention are not particularly limited, and the component herein may be arbitrarily selected among those conventionally used in a lithography process.

The film forming composition may contain a surfactant, a coating film resin, and a solvent. The composition may contain a cross-linking agent, an acid, an acid generator, and an absorptive compound, for example, as necessary. The coating film resin is a resin capable of being mainly used in film formation, and examples of the resin include a novolac resin, a condensation epoxy resin, a (meth)acrylic resin, a polyether-based resin, and a silicon-containing resin.

A solid content of the composition is 0.1% by mass to 70% by mass or 0.1% by mass to 60% by mass. The solid content is a content ratio of the component of the film forming composition from which the solvent is removed.

In the solid content, the coating film resin can be included in a ratio of 1% by mass to 99.9% by mass, 50% by mass to 99.9% by mass, 50% by mass to 95% by mass, or 50% by mass to 90% by mass.

The coating film resin has a weight average molecular weight of 600 to 1,000,000 or 600 to 200,000.

The novolac resin can be obtained by a reaction of an aromatic compound with aldehyde or ketone. Examples of the aromatic compound include phenolic hydroxy group-containing compounds, such as phenol, cresol, and naphthol, carbazole, phloroglucinol, phenylnaphthylamine, phenothiazine, phenylindole, polynuclear phenol, pyrrole, and derivatives thereof.

Examples of aldehydes include saturated aliphatic aldehydes, such as formaldehyde, paraformaldehyde, acetoaldehyde, propyl aldehyde, butylaldehyde, isobutyl aldehyde, valeraldehyde, capronaldehyde, 2-methylbutylaldehyde, hexylaldehyde, undecanealdehyde, 7-methoxy-3,7-dimethyloctylaldehyde, cyclohexanealdehyde, 3-methyl-2-butyraldehyde, glyoxal, malonaldehyde, succinaldehyde, glutaraldehyde, glutaraldehyde, and adipaldehyde, unsaturated aliphatic aldehydes such as acrolein and methacrolein, heterocyclic aldehydes such as furfural, pyridine aldehyde, and thiophene aldehyde, and aromatic aldehydes such as benzaldehyde, naphthaldehyde, anthracenecarboxaldehyde, phenylbenzaldehyde, anisaldehyde, terephthalaldehyde, pyrenecarboxaldehyde, phenanthrylaldehyde, salicylaldehyde, phenylacetaldehyde, 3-phenylpropionaldehyde, tolylaldehyde, (N,N-dimethylamino)benzaldehyde, and acetoxybenzaldehyde.

A diarylketone is used as a ketone, and examples of the diarylketone include diphenylketone, phenyl naphthylketone, dinaphthylketone, phenyltolylketone, ditolylketone, and 9-fluorenone.

In a novolac resin obtained by condensing an aromatic compound and an aldehyde or a ketone, the aldehyde or the ketone can be used in a ratio of 0.1 equivalents to 10 equivalents to 1 equivalent of the phenyl group in the aromatic compound.

As an acid catalyst used in the condensation reaction, mineral acids such as sulfuric acid, phosphoric acid, and perchloric acid, organic sulfonic acids such as p-toluenesulfonic acid and p-toluenesulfonic acid monohydrate, and carboxylic acids such as formic acid and oxalic acid are used, for example. A used amount of the acid catalyst is variously selected depending on the acid used. The used amount is 0.001 parts by mass to 10,000 parts by mass, preferably 0.01 parts by mass to 1,000 parts by mass, and more preferably 0.1 parts by mass to 100 parts by mass relative to 100 parts by mass of the aromatic compound.

Although the condensation reaction is carried out without a solvent, the reaction is usually carried out using a solvent. Any solvent can be used as long as the solvents do not inhibit the reaction. Examples of the solvents include cyclic ethers such as tetrahydrofuran and dioxane. When the acid catalyst used is a liquid acid such as formic acid, the acid catalyst can also act as the solvent.

A reaction temperature at the time of the condensation is usually 40° C. to 200° C. A reaction time is variously selected depending on the reaction temperature and is usually approximately 30 minutes to 50 hours.

A condensation epoxy resin is a resin obtained by condensation reaction of epoxy group with carboxy group, hydroxy group, or an active hydrogen containing group. The resin has epoxy group in one monomer, has carboxy group, hydroxy group, or an active hydrogen containing group in the other monomer, and can be polymerized by condensation reaction.

Examples of these monomers include a nitrogen-containing monomer, an aromatic monomer, and an aliphatic monomer including a pyrimidinetrione structure, an imidazolidinedione structure, or a triazinetrione structure.

Examples of a monomer having epoxy group include diglycidyl hydantoin compounds such as 1,3-diglycidyl hydantoin, diglycidyl barbituric acid compounds such as 1,3-diglycidyl-5,5-diethyl barbituric acid, diglycidyl isocyanuric acid compounds such as monoallyl diglycidyl isocyanuric acid, terephthalic acid diglycidyl ester, phthalic acid diglycidyl ester compounds, diglycidyl ether compounds such as ethylene glycol diglycidyl ether, naphthalene dicarboxylic acid diglycidyl ester compounds, aliphatic dicarboxylic acid diglycidyl ester compounds such as 1,2-cyclohexanedicarboxylic acid diglycidyl ester and 1,3-propanedicarboxylic acid diglycidyl ester, and tris-(2,3-epoxypropyl)-isocyanurate.

Examples of a carboxy group-containing monomer include terephthalic acid, isophthalic acid, phthalic acid, 2,5-dimethyl terephthalic acid, 2,5-diethyl terephthalic acid, 2,3,5,6-tetrachloro terephthalic acid, 2,3,5,6-tetrabromo terephthalic acid, 2-nitro terephthalic acid, 2,3,5,6-tetrafluoro terephthalic acid, 2,5-dihydroxyterephthalic acid, 2,6-dimethyl terephthalic acid, 2,5-dichloro terephthalic acid, 2,3-dichloro isophthalic acid, 3-nitro isophthalic acid, 2-bromo isophthalic acid, 2-hydroxyisophthalic acid, 3-hydroxyisophthalic acid, 2-methoxy isophthalic acid, 5-phenyl isophthalic acid, 3-nitro phthalic acid, 3,4,5,6-tetrachloro phthalic acid, 4,5-dichloro phthalic acid, 4-hydroxyphthalic acid, 4-nitro phthalic acid, 4-methyl phthalic acid, 3,4,5,6-tetrafluoro phthalic acid, 2,6-naphthalene dicarboxylic acid, 1,2-naphthalene dicarboxylic acid, 1,4-naphthalene dicarboxylic acid, 1,8-naphthalene dicarboxylic acid, anthracene-9,10-dicarboxylic acid, fumaric acid, and maleic acid.

Examples of hydroxy group-containing monomer include ethylene glycol and 4-hydroxybenzoic acid.

Examples of an active hydrogen containing group monomer include hydantoin compounds, barbituric acid compounds, monoallyl isocyanuric acid, and isocyanuric acid.

The condensation reaction is preferably conducted in a solution in which the compounds are dissolved in an organic solvent such as benzene, toluene, xylene, ethyl lactate, butyl lactate, propylene glycol monomethylether, propylene glycol monomethylether acetate, and N-methyl pyrrolidone. In the reaction, a quaternary ammonium salt such as benzyltriethyl ammonium chloride, tetrabutyl ammonium chloride, and tetraethyl ammonium bromide can be used as a catalyst. Although the reaction temperatures and the reaction time for the reaction depend on the compounds used, concentrations, and the like, the reaction time is suitably selected from a range from 0.1 hours to 100 hours, and the reaction temperature is suitably selected from a range from 20° C. to 200° C. A catalyst can be used within a range from 0.001% by mass to 30% by mass relative to the total mass of compounds used.

Examples of a (meth)acrylic resin include polymers containing (meth)acrylic acid, (meth)acrylic acid ester, and a vinyl compound.

Examples of (meth)acrylic acid ester include lactone (meth)acrylate such as γ-butyrolactone (meth)acrylate, alkyl (meth)acrylates, hydroxy alkyl(meth)acrylates such as hydroxy ethyl methacrylate, (meth)acrylamides, and aromatic(meth)acrylates such as phenyl(meth)acrylate and benzil(meth)acrylate.

Examples of vinyl compounds include vinyl ethers such as alkyl vinyl ethers and vinyl aryl ethers and styrenes such as styrene, hydroxy styrene, and alkoxystyrenes.

Polymers of the vinyl compound may include any of a random copolymer, a block copolymer, and a graft copolymer. A resin forming an antireflection film according to the present invention can be synthesized by radical polymerization, anionic polymerization, cationic polymerization, or the like. A variety of methods in such forms as solution polymerization, suspension polymerization, emulsion polymerization, and mass polymerization can be employed.

As a polyether-based resin, a chain resin containing an ether bond in the main chain is preferable. In the ether bond, polyether resins in which aliphatic cyclic hydrocarbon rings are connected by the ether bond can be preferably used. The polyether resins are resins having a structure in which an epoxy group is linked to the aliphatic cyclic hydrocarbon ring, and examples of the polyether resin include an adduct of 2,2-bis(hydroxymethyl)-1-butanol with 1,2-epoxy-4-(2-oxiranyl)cyclohexane (manufactured by Daicel Chemical Industries, Ltd., trade name: EHPE 3150) and a mixture of an adduct of 2,2-bis(hydroxymethyl)-1-butanol with 1,2-epoxy-4-(2-oxiranyl)cyclohexane and 3,4-epoxycyclohexenylmethyl-3',4'-epoxycyclohexene carboxylate (manufactured by Daicel Chemical Industries, Ltd., trade name: EHPE3150CE).

Furthermore, as a polyether resin, a condensed-ring aromatic carboxylic acid or a monocyclic aromatic carboxylic acid reacted with an epoxy group of the polyether resin having the epoxy group can be used. The condensed-ring aromatic carboxylic acid and the monocyclic aromatic carboxylic acid are preferably carboxylic acids containing benzene or a ring including a condensed benzene ring. The condensed-ring aromatic carboxylic acid is, for example, carboxylic acids having a polycyclic structure formed by condensation of benzene rings. Examples thereof include naphthalenecarboxylic acid and anthracenecarboxylic acid, and particularly preferable is 9-anthracenecarboxylic acid. As the monocyclic aromatic carboxylic acid, benzoic acid is preferably used.

The condensed-ring aromatic carboxylic acid and the monocyclic aromatic carboxylic acid can be used as a mixture, and the mixture can be used in a molar ratio of 3:7 to 7:3 and preferably in a molar ratio of 4:6 to 6:4.

Examples of a silicon-containing resin include a condensate obtained by hydrolyzing a hydrolysable silane. This is a polysiloxane and includes an organosiloxane. A hydrolysable silane is obtained by hydrolyzing at least one kind of hydrolysable silane selected from the group consisting of a hydrolysable silane having four hydrolysable groups, a hydrolysable silane having three hydrolysable groups, a hydrolysable silane having two hydrolysable groups, and a hydrolysable silane having one hydrolysable group. Hydrolysis is carried out by adding a catalyst (for example, an acid catalyst or a basic catalyst) in an organic solvent, and after that, condensation is carried out by heating to obtain a hydrolysis-condensation product (polysiloxane and organopolysiloxane).

The film forming composition according to the present invention can contain a crosslinking agent. Examples of the crosslinking agent include a melamine-based agent, a substituted urea-based agent, or a polymer-based agent thereof. Preferably, the crosslinking agent has at least two crosslink-forming substituents. Examples of the crosslinking agent include compounds such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, and methoxymethylated thiourea. A condensate of these compounds can also be used.

As the crosslinking agent, a crosslinking agent having high heat resistance can be used. As the crosslinking agent having high heat resistance, a compound containing crosslink-forming substituents having aromatic rings (for example, a benzene ring or a naphthalene ring) in a molecule can preferably be used.

An added amount of the crosslinking agent varies depending on an application solvent used, a base substrate used, a required solution viscosity, required film shape, and the like. The added amount can be 0.001% by mass to 80% by mass, preferably 0.01% by mass to 50% by mass, and further preferably 0.05% by mass to 40% by mass relative to the total solid content. Although these crosslinking agents may cause a crosslink reaction by self-condensation, when crosslinkable substituents exist in the polymer according to the present invention, the crosslinking agent can cause a crosslink reaction with these crosslinkable substituents.

Examples of catalysts for accelerating the crosslink reaction mixed in the present invention include acid compounds such as p-toluenesulfonic acid, trifluoromethanesulfonic acid, pyridinium p-toluenesulfonic acid, salicylic acid, sulfosalicylic acid, citric acid, benzoic acid, hydroxybenzoic acid, and naphthalene carboxylic acid and/or thermal acid generators such as 2,4,4,6-tetrabromocyclohexadienone, benzoin tosylate, 2-nitrobenzyl tosylate, and other organic sulfonic acid alkyl esters. An amount of the catalyst mixed is 0.0001% by mass to 20% by mass, preferably 0.0005% by mass to 10% by mass, and preferably 0.01% by mass to 3% by mass to the total solid content.

In the present invention, a photoacid generator can be added in order to match acidity of the composition to a photoresist covered in a lithography process. Examples of the preferable photoacid generator include onium salt-based photoacid generators such as bis(4-t-butylphenyl)iodonium trifluoromethanesulfonate and triphenylsulfonium trifluoromethanesulfonate, halogen-containing compound-based photoacid generators such as phenyl-bis(trichloromethyl)-s-triazine, and sulfonic acid-based photoacid generators such as benzoin tosylate and N-hydroxysuccinimide trifluoromethanesulfonate. An amount of the photoacid generator added is 0.2% by mass to 10% by mass and preferably 0.4% by mass to 5% by mass relative to the total solid content.

To the film forming composition according to the present invention, for example, a light absorbent, a rheology modifier, and an adhesion assistance agent can be further added in addition to the components described above if necessary.

As further light absorbents, for example, commercially available light absorbents described in "Kogyoyou Shikiso no Gijyutu to Shijyo (Technology and Market of Industrial Colorant)" (CMC Publishing Co., Ltd) and "Senryo Binran (Dye Handbook)" (The Society of Synthetic Organic Chemistry, Japan) can be preferably used. Examples of the commercially available light absorbents include C. I. Disperse Yellow 1, 3, 4, 5, 7, 8, 13, 23, 31, 49, 50, 51, 54, 60, 64, 66, 68, 79, 82, 88, 90, 93, 102, 114, and 124; C. I. Disperse Orange 1, 5, 13, 25, 29, 30, 31, 44, 57, 72, and 73; C. I. Disperse Red 1, 5, 7, 13, 17, 19, 43, 50, 54, 58, 65, 72, 73, 88, 117, 137, 143, 199, and 210; C. I. Disperse Violet 43; C. I. Disperse Blue 96; C. I. Fluorescent Brightening Agent 112, 135, and 163; C. I. Solvent Orange 2 and 45; C. I. Solvent Red 1, 3, 8, 23, 24, 25, 27, and 49; C. I. Pigment Green 10; and C. I. Pigment Brown 2. The light absorbents are usually mixed in ratio of 10% by mass or less, and preferably in a ratio of 5% by mass or less relative to the total solid content of the film forming composition.

A rheology modifier is added for the purpose of mainly improving flowability of a film forming composition, and, particularly in a baking process, improving film thickness uniformity of a resist underlayer film and enhancing filling properties of a resist underlayer film forming composition into a hole. Specific examples of the rheology modifier include phthalic acid derivatives such as dimethyl phthalate, diethyl phthalate, diisobutyl phthalate, dihexyl phthalate, and butyl isodecyl phthalate, adipic acid derivatives such as di-normal-butyl adipate, diisobutyl adipate, diisooctyl adipate, and octyldecyl adipate, maleic acid derivatives such as di-normal-butylmaleate, diethyl maleate, and dinonyl maleate, oleic acid derivatives such as methyl oleate, butyl oleate, and tetrahydrofurfuryl oleate, or stearic acid derivatives such as normal-butyl stearate and glyceryl stearate. These rheology modifiers are usually mixed in a ratio of less than 30% by mass relative to the total solid content of the film forming composition for lithography.

An adhesion assistance agent is added for the purpose of mainly improving adhesion between the substrate or the resist and the film forming composition and, particularly in development, preventing the resist from peeling. Specific examples of the adhesion assistance agent include chlorosilanes such as trimethylchlorosilane, dimethylvinylchlorosilane, methyldiphenylchlorosilane, and chloromethyldimethylchlorosilane, alkoxysilanes such as trimethylmethoxysilane, dimethyldiethoxysilane, methyldimethoxysilane, dimethylvinylethoxysilane, diphenyldimethoxysilane, and phenyltriethoxysilane, silazanes such as hexamethyldisilazane, N,N'-bis(trimethylsilyl)urea, dimethyltrimethylsilylamine, and trimethylsilylimidazole, silanes such as vinyltrichlorosilane, γ-chloropropyltrimethoxysilane, γ-aminopropyltriethoxysilane, and γ-glycidoxypropyltrimethoxysilane, heterocyclic compounds such as benzotriazole, benzimidazole, indazole, imidazole, 2-mercaptobenzimidazole, 2-mercaptobenzothiazole, 2-mercaptobenzoxazole, urazol, thiouracil, mercaptoimidazole, and mercaptopyrimidine, and urea compounds or thiourea compounds such as 1,1-dimethylurea and 1,3-dimethylurea. These adhesion assistance agents are usually mixed in a ratio less than 5% by mass, and preferably in a ratio of less than 2% by mass relative to the total solid content of the film forming composition for lithography.

Examples of solvents used for dissolving the coating film resin, the surfactant, the crosslinking agent, the crosslinking catalyst, and the like in the present invention include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol monoethyl ether, propylene glycol monoethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methyl-propionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate. These organic solvents can be used singly or in combination of two or more organic solvents.

These solvents can be used by mixing with a high boiling point solvent such as propylene glycol monobutyl ether and propylene glycol monobutyl ether acetate. Among these solvents, propylene glycol monomethyl ether, propylene glycol monomethyl ether acetate, ethyl lactate, butyl lactate, cyclohexanone, and the like are preferable from the viewpoint of improving a leveling property.

The resist used in the present invention is a photoresist, an electron beam resist, or an EUV resist.

As the photoresist used together with the film forming composition for lithography according to the present invention, both a negative type photoresist and a positive type photoresist can be used. Examples of the photoresists include a positive type photoresist made of a novolac resin and 1,2-naphthoquinonediazidesulfonic acid ester; a chemically amplified photoresist made of a binder having a group that increases an alkali dissolution rate by decomposing with an acid, and a photoacid generator; a chemically amplified photoresist made of an alkali-soluble binder, a low molecular weight compound that increases an alkali dissolution rate of the photoresist by decomposing with an acid, and a photoacid generator; a chemically amplified photoresist made of a binder having a group that increases an alkali dissolution rate by decomposing with an acid, a low molecular weight compound that increases an alkali dissolution rate of the photoresist by decomposing with an acid, and a photoacid generator; and a photoresist having Si atoms in the framework of the molecule. Specific examples include APEX-E (trade name, manufactured by Rohm and Haas Inc.)

Examples of the electron beam resist used together with the film forming composition for lithography according to the present invention include a composition made of a resin containing Si—Si bonds in the main chain and containing aromatic rings at its ends and an acid generator generating an acid by irradiation with an electron beam, and a composition made of a poly(p-hydroxystyrene) in which hydroxy group is substituted with an organic group containing N-carboxyamine and an acid generator generating an acid by irradiation with an electron beam. The latter electron beam resist composition is an electron beam resist composition in which an acid generated from an acid generator by electron beam irradiation reacts with N-carboxyaminoxy group in a polymer side chain and the polymer side chain is decomposed to hydroxy group, and thus the resist composition is dissolved into an alkali development solution due to its alkali solubility to form a resist pattern. Examples of the acid generator generating an acid by the electron beam irradiation include halogenated organic compounds such as 1,1-bis[p-chlorophenyl]-2,2,2-trichloroethane, 1,1-bis[p-methoxyphenyl]-2,2,2-trichloroethane, 1,1-bis[p-chlorophenyl]-2,2-dichloroethane, and 2-chloro-6-(trichloromethyl)pyridine, onium salts such as triphenyl sulfonium salt and diphenyl iodonium salt, and sulfonic acid esters such as nitrobenzyltosylate and dinitrobenzyltosylate.

As the EUV resist used together with the film forming composition for lithography according to the present invention, an acrylic resist can be used.

Examples of development solutions for the resist having the film formed by using the film forming composition for lithography according to the present invention include solutions of inorganic alkalis such as sodium hydroxide, potassium hydroxide, sodium carbonate, sodium silicate, sodium metasilicate, and aqueous ammonia, primary amines such as ethylamine and n-propylamine, secondary amines such as diethylamine and di-n-butylamine, tertiary amines such as triethylamine and methyldiethylamine, alcoholamines such as dimethylethanolamine and triethanolamine, quaternary ammonium salts such as tetramethylammonium hydroxide, tetraethylammonium hydroxide, and choline, and cyclic amines such as pyrrole and piperidine. The resist development solution can also be used by adding an adequate amount of alcohols such as isopropyl alcohol and surfactants such as a nonion type surfactant to the aqueous solution of the alkalis. Among these development solutions, aqueous solutions of the quaternary ammonium salts are preferable, and aqueous solutions of tetraethylammonium hydroxide and choline are more preferable.

Furthermore, an organic solvent can be used for a development solution. Examples of the development solution include: methyl acetate, butyl acetate, ethyl acetate, isopropyl acetate, amyl acetate, isoamyl acetate, methoxyethyl acetate, ethoxyethyl acetate, propylene glycol monomethyl ether, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxy butyl acetate, 3-methoxy butyl acetate, 4-methoxy butyl acetate, 3-methyl-3-methoxy butyl acetate, 3-ethyl-3-methoxy butyl acetate, propylene glycol monomethyl ether acetate, propylene glycol monoethyl ether acetate, propylene glycol monopropyl ether acetate, 2-ethoxy butyl acetate, 4-ethoxy butyl acetate, 4-propoxy butyl acetate, 2-methoxy pentyl acetate, 3-methoxy pentyl acetate, 4-methoxy pentyl acetate, 2-methyl-3-methoxy pentyl acetate, 3-methyl-3-methoxy pentyl acetate, 3-methyl-4-methoxy pentyl acetate, 4-methyl-4-methoxy pentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, 2-hydroxypropionic acid methyl, 2-hydroxypropionic acid ethyl, methyl-3-methoxy propionate, ethyl-3-methoxy propionate, ethyl-3-ethoxy propionate, and propyl-3-methoxy propionate. A surfactant and the like can further be added to the development solution. A condition of development is suitably selected from the temperature from 5° C. to 50° C., and the time from 10 seconds to 600 seconds.

The film forming composition for lithography according to the present invention can be, as a film used in a lithography process, used as a resist underlayer film or a resist overlayer film. Accordingly, there are the cases where the film forming composition according to the present invention is a resist underlayer film forming composition and the cases where the film forming composition is a resist overlayer film forming composition.

First, the case where the present invention is the resist underlayer forming composition will be described. A method for forming a resist pattern will be described. The resist underlayer film forming composition according to the present invention is applied onto a substrate (for example, silicon/silicon dioxide coating, a glass substrate, an ITO substrate, and other transparent substrates) used for producing precision integrated circuit devices by an adequate coating method such as a spinner, a coater, or the like and thereafter the applied composition is cured by baking to form an coating type underlayer film. A film thickness of the resist underlayer film is preferably 0.01 μm to 3.0 Conditions for baking after application are 80° C. to 350° C. for 0.5 minutes to 120 minutes. Thereafter, the resist is directly applied onto the resist underlayer film or applied after forming a film of one layer or several layers of a coating material on the resist underlayer film if necessary. Then, the resist is irradiated with light or an electron beam through a predetermined mask and is developed, rinsed, and dried to be able to obtain a good resist pattern. Post Exposure Bake (PEB) after irradiation with light or an electron beam can also be carried out if necessary. A portion of the resist underlayer film where the resist is removed by development in the previous process is removed by dry etching to be able to form a desired pattern on the substrate.

The exposure light of the photoresist is actinic rays such as near ultraviolet rays, far ultraviolet rays, or extreme ultraviolet rays (for example, EUV, wavelength: 13.5 nm) and, for example, light having a wavelength of 248 nm (KrF laser light), 193 nm (ArF laser light), or 13.5 nm (EUV light) is used. Any light irradiation can be used without limitation as long as an acid is generated from a photoacid generator. An exposure amount is 1 mJ/cm$^2$ to 2,000 mJ/cm$^2$, 10 mJ/cm$^2$ to 1,500 mJ/cm$^2$, or 50 mJ/cm$^2$ to 1,000 mJ/cm$^2$.

The electron beam irradiation for the electron beam resist can be performed by, for example, an electron beam irradiation device.

Accordingly, the present invention includes a method for manufacturing a semiconductor device, including a process of forming an underlayer film by use of a film forming composition (underlayer film forming composition) on a semiconductor substrate, a process of forming a resist film on the underlayer film, a process of forming a resist pattern by irradiation with light, EUV, or an electron beam and development, a process of etching the underlayer film by use of the formed resist pattern, and a process of processing the semiconductor substrate by use of the patterned underlayer film.

Hereinafter, when formation of finer resist pattern progresses, an issue of resolution and an issue of resist pattern collapse after development arise and thus thinner resist film formation is desired. Therefore, it is difficult to obtain a sufficient resist pattern film thickness in substrate processing. As a result, a process has been required in which not only the resist pattern but also a resist underlayer film formed between the resist and the semiconductor substrate to be processed has a function as a mask at the time of the substrate processing. As a resist underlayer film for the process as described above, unlike a conventional high etch rate resist underlayer film, a resist underlayer film for lithography having a selection ratio of the dry etching rate close to that of the resist, a resist underlayer film for lithography having a selection ratio of the dry etching rate smaller than that of the resist, and a resist underlayer film for lithography having a selection ratio of the dry etching rate smaller than that of the semiconductor substrate have been required. The resist underlayer film described above can also be provided with an anti-reflection function and can also have a function of the conventional anti-reflective coatings.

On the other hand, in order to obtain a fine resist pattern, a process in which, at the time of dry etching of the resist underlayer film, the resist pattern and the resist underlayer film are formed so as to be narrower than a pattern width at the time of resist development has started to be used. As the resist underlayer film used for the process described above, unlike a conventional high etch rate anti-reflective coating, a resist underlayer film having a selection ratio of the dry etching rate close to that of the resist has been required. The resist underlayer film described above can also be provided with an anti-reflection function and can also have a function of the conventional anti-reflective coatings.

In the present invention, after the resist underlayer film according to the present invention is formed on a substrate, a resist can be directly applied onto the resist underlayer film or applied after forming a film of one layer or several layers of a coating material on the resist underlayer film if necessary. Consequently, the pattern width of the resist becomes narrower, and the substrate can be processed by selecting adequate etching gas even when the resist is thinly applied in order to prevent pattern collapse.

Namely, the present invention further includes a method for manufacturing a semiconductor device, including a process of forming an underlayer film by use of a film forming composition (underlayer film forming composition) on a semiconductor substrate, a process of forming a hard mask on the underlayer film, a process of further forming a resist film on the hard mask, a process of forming a resist pattern by irradiation with light, EUV, or an electron beam and development, a process of etching the hard mask by use of the formed resist pattern, a process of etching the underlayer film by use of the patterned hard mask, and a process of processing the semiconductor substrate by use of the patterned underlayer film.

The present invention furthermore includes a method for manufacturing a semiconductor device, including a process of forming an organic underlayer film on a semiconductor substrate, a process of applying the film forming composition according to the present invention (resist underlayer film forming composition of silicon-containing resin) onto the organic underlayer film and baking the composition to form a resist underlayer film, a process of applying a composition for a resist on the resist underlayer film to form a resist film, a process of exposing the resist film with light, EUV, or an electron beam, a process of developing the resist film after exposure to obtain a resist pattern, a process of etching the resist underlayer film by use of the resist pattern, a process of etching the organic underlayer film by use of the patterned resist underlayer film, and a process of processing a semiconductor substrate by use of the patterned organic underlayer film.

In the present invention, a semiconductor device can be manufactured through a process of forming the resist underlayer film on a semiconductor substrate by use of the resist underlayer film forming composition according to the present invention, a process of forming a hard mask made of a coating material containing a silicon component or the like or a hard mask (for example, silicon oxynitride) formed by vapor deposition on the resist underlayer film, further forming a resist film on the hard mask, forming a resist pattern by irradiation with light or an electron beam and development, a process of etching the hard mask by use of the formed resist pattern with halogen-based gas, a process of etching the resist underlayer film by use of the patterned hard mask with oxygen-based gas or hydrogen-based gas, and a process of processing the semiconductor substrate by use of the patterned resist underlayer film with halogen-based gas.

Next, the case where the present invention is the resist overlayer forming composition will be described.

The method for manufacturing a semiconductor device may include a process of forming a resist film (EUV resist film) on a semiconductor substrate, a process of applying the film forming composition according to the present invention (resist overlayer film forming composition) onto the resist film and baking the composition to form a resist overlayer film, a process of exposing a semiconductor substrate, covered with the resist overlayer film and the resist film, with light, EUV, or an electron beam, and a process of developing the substrate after exposure to remove the resist overlayer film and the resist film.

When an EUV resist is used, exposure is carried out by use of EUV (wavelength: 13.5 nm).

EXAMPLES

Production Examples of Coating Resin

Synthesis Example 1

15.0 g of an epoxy cresol novolac resin (manufactured by Asahi Ciba Co., Ltd., trade name: ECN1299), 10.2 g of 4-hydroxybenzaldehyde (manufactured by Tokyo Chemical Industry Co., Ltd.), and 0.08 g of tetramethylammonium hydroxide (manufactured by Tokyo Chemical Industry Co., Ltd.) were dissolved in 60.0 g of propylene glycol monomethyl ether and then reacted at 130° C. for 6 hours. Then, the solution temperature was decreased to 60° C., and 5.5 g of malononitrile (manufactured by Tokyo Chemical Industry Co., Ltd.) was added to be reacted for 2 hours and, thus, to obtain a solution containing a resin.

When the obtained resin was subjected to a GPC analysis, the resin was found to have a weight average molecular weight of 3,300 in terms of standard polystyrene. The obtained resin is considered to be a resin (referred to as the coating film resin 1) having a repeating unit structure of Formula 1.

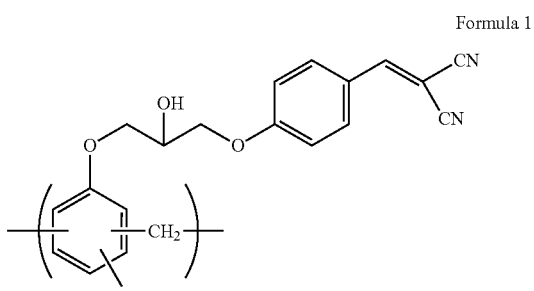

Formula 1

Synthesis Example 2

100 g of monoallyl diglycidyl isocyanuric acid (manufactured by Shikoku Chemicals Corporation), 66.4 g of 5,5-diethyl barbituric acid, and 4.1 g of benzyltriethyl ammonium chloride were dissolved in 682 g of propylene glycol monomethyl ether and then reacted at 130° C. for 24 hours to obtain a solution containing a polymer. When the obtained polymer was subjected to a GPC analysis, the polymer was found to have a weight average molecular weight of 6,800 in terms of standard polystyrene. The obtained resin is considered to be a resin (referred to as the coating film resin 2) having a repeating unit structure of Formula 2.

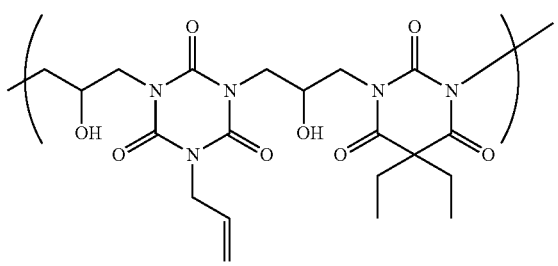

Formula 2

Synthesis Example 3

15.0 g of p-t-butoxystyrene (manufactured by Tosoh Corporation, trade name: PTBS), 19.9 g of methyl methacrylate (manufactured by Tokyo Chemical Industry Co., Ltd.), and 2.1 g of 2,2'-azobis (isobutyric acid) dimethyl (manufactured by Wako Pure Chemical Industries, Ltd.) were dissolved in 86.3 g of propylene glycol monomethyl ether, and the solution was added dropwise into 61.6 g of propylene glycol monomethyl ether heated to 80° C. in a nitrogen atmosphere. After the completion of the dropwise addition, the reaction was continued for 18 hours while maintaining a temperature of 80° C. Then, the reaction mixed solution was added dropwise into diethyether-hexane to precipitate a resin. When the obtained resin was subjected to a GPC analysis, the resin was found to have a weight average molecular weight of 12,000 in terms of standard polystyrene.

20.0 g of the obtained resin was dissolved in 100 g of acetone. 1.0 g of 1N-hydrochloric acid was added dropwise while heating to reflux in a nitrogen atmosphere. After the completion of the dropwise addition, the reaction was continued for 18 hours while maintaining heating to reflux. Then, the reaction mixed solution was added dropwise into water to precipitate a resin. The obtained resin is considered to be a resin (referred to as the coating film resin 3) having a repeating unit structure of Formula 3 according to 13C-NMR.

The unit structure derived from p-t-butoxystyrene in the entire resin was 30 mol %, and the unit structure derived from methyl methacrylate was 70 mol %.

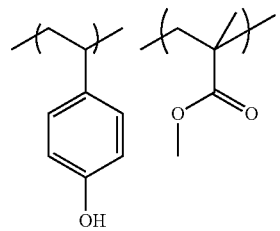

Formula 3

Example 1

0.45 g of hexamethoxymethylmelamine (trade name: Cymel 303 manufactured by Mitsui Cytec Ltd.), 0.02 g of p-toluenesulfonic acid, 0.01 g of a surfactant (trade name: MEGAFACE R-40 manufactured by Dainippon Ink and Chemicals Inc.) containing a polymer and an oligomer having a perfluorobutyl partial structure, 9.00 g of propylene glycol monomethyl ether, and 3.80 g of ethyl lactate were added to 3.20 g of the solution of the coating film resin 1 obtained in Synthesis Example 1 to prepare a solution. Then, the solution was filtered through a polystyrene microfilter having a pore size of 0.10 μm and further filtered through a polystyrene microfilter having a pore size of 0.05 μm to prepare a film forming composition (resist underlayer film forming composition).

Example 2

0.15 g of tetramethoxymethyl glycoluril (manufactured by Mitsui Cytec Ltd., trade name: Powderlink 1174), 0.01 g of pyridinium-p-toluenesulfonate, 0.002 g of a surfactant (trade name: MEGAFACE R-40 manufactured by Dainippon Ink and Chemicals Inc.) containing a polymer and an oligomer having a perfluorobutyl partial structure, 31.20 g of propylene glycol monomethyl ether, and 15.55 g of propylene glycol monomethyl ether acetate were added to 4.20 g of the solution of the coating film resin 2 obtained in Synthesis Example 2 to prepare a solution. Then, the solution was filtered through a polyethylene microfilter having a pore size of 0.10 μm and further filtered through a polyethylene microfilter having a pore size of 0.05 μm to prepare a solution of a film forming composition (resist underlayer film forming composition).

Example 3

0.60 g of hexamethoxymethylmelamine (trade name: Cymel 303 manufactured by Mitsui Cytec Ltd.), 0.002 g of p-toluenesulfonic acid, 0.01 g of a surfactant (trade name: MEGAFACE R-40 manufactured by Dainippon Ink and Chemicals Inc.) containing a polymer and an oligomer having a perfluorobutyl partial structure, 3.8 g of propylene glycol monomethyl ether, and 16.50 g of propylene glycol monomethyl ether acetate were added to 2.00 g of the coating film resin 3 obtained in Synthesis Example 3 to prepare a solution. Then, the solution was filtered through a polyethylene microfilter having a pore size of 0.10 µm and further filtered through a polyethylene microfilter having a pore size of 0.05 µm to prepare a solution of a film forming composition (resist overlayer film forming composition).

Comparative Example 1

0.45 g of hexamethoxymethylmelamine (trade name: Cymel 303 manufactured by Mitsui Cytec Ltd.), 0.02 g of p-toluenesulfonic acid, 0.03 g of a surfactant (trade name: MEGAFACE R-30 manufactured by Dainippon Ink and Chemicals Inc.) containing a polymer and an oligomer having a perfluorooctyl partial structure, 9.00 g of propylene glycol monomethyl ether, and 3.80 g of ethyl lactate were added to 3.20 g of the coating film resin 1 obtained in Synthesis Example 1 to prepare a solution. Then, the solution was filtered through a polystyrene microfilter having a pore size of 0.10 µm and further filtered through a polystyrene microfilter having a pore size of 0.05 µm to prepare a film forming composition (resist underlayer film forming composition).

Comparative Example 2

0.15 g of tetramethoxymethyl glycoluril (manufactured by Mitsui Cytec Ltd., trade name: Powderlink 1174), 0.01 g of pyridinium-p-toluenesulfonate, 0.004 g of a surfactant (trade name: MEGAFACE R-30 manufactured by Dainippon Ink and Chemicals Inc.) containing a polymer and an oligomer having a perfluorooctyl partial structure, 31.20 g of propylene glycol monomethyl ether, and 15.55 g of propylene glycol monomethyl ether acetate were added to 4.20 g of the solution of the coating film resin 2 obtained in Synthesis Example 2 to prepare a solution. Then, the solution was filtered through a polyethylene microfilter having a pore size of 10 µm and further filtered through a polyethylene microfilter having a pore size of 0.05 µm to prepare a solution of a film forming composition (resist underlayer film forming composition).

Comparative Example 3

0.60 g of hexamethoxymethylmelamine (trade name: Cymel 303 manufactured by Mitsui Cytec Ltd.), 0.002 g of p-toluenesulfonic acid, 0.01 g of a surfactant (trade name: MEGAFACE R-30 manufactured by Dainippon Ink and Chemicals Inc.) containing a polymer and an oligomer having a perfluorooctyl partial structure, 3.8 g of propylene glycol monomethyl ether, and 16.50 g of propylene glycol monomethyl ether acetate were added to 2.00 g of the coating film resin 3 obtained in Synthesis Example 3 to prepare a solution. Then, the solution was filtered through a polyethylene microfilter having a pore size of 0.10 µm and further filtered through a polyethylene microfilter having a pore size of 0.05 µm to prepare a solution of a film forming composition (resist overlayer film forming composition).

[Formation of Organic Anti-Reflective Coating and Measurement of Height of Edge Reservoir]

The film forming compositions prepared in Examples 1 to 3 and Comparative Examples 1 to 3 were each applied onto an 8 inch silicon wafer by a spinner. In the coating process, a film was formed under the conditions in Table 1.

Subsequently, a substrate edge portion was cleaned (edge rinse). Namely, while the substrate having the film was rotated at a rotating speed of 1200 rpm, an organic solvent for cleaning (an edge rinse liquid, a back rinse liquid) was discharged for 6 seconds to remove an unnecessary portion of the film. Subsequently, spinning-off of the organic solvent for cleaning was performed by rotating the substrate at a rotating speed of 1,500 rpm for 10 seconds. As the organic solvent for cleaning, a mixed solution of propylene glycol monomethyl ether and propylene glycol monomethyl ether acetate in a weight ratio of 7/3 was used.

Then, the substrate having the film was heated and baked under the conditions in Table 1 to form films (a resist underlayer film and a resist overlayer film). Then, the height of an edge reservoir at a periphery of each film was measured by use of a stylus-type film thickness meter DEKTAK 6M (manufactured by VEEO METROLOGY GROUP). In the measurement, the height was measured at four points ((a), (b), (c), and (d)) on the substrate, and the mean value was taken as the measured value.

TABLE 1

| | Rotating speed/Time | Heating temperature/Time | Film thickness (nm) |
|---|---|---|---|
| Example 1 | 3,500 rpm/60 sec. | 175° C./60 sec. | 110 |
| Example 2 | 1,500 rpm/60 sec. | 205° C./60 sec. | 30 |
| Example 3 | 1,500 rpm/60 sec. | 205° C./60 sec. | 150 |
| Comparative Example 1 | 3,500 rpm/60 sec. | 175° C./60 sec. | 110 |
| Comparative Example 2 | 1,500 rpm/60 sec. | 205° C./60 sec. | 30 |
| Comparative Example 3 | 1,500 rpm/60 sec. | 205° C./60 sec. | 150 |

In Table 2, as "Coating Film Resin", the coating film resins 1 to 3 obtained in Synthesis Example 1 to Synthesis Example 3 were used. In the column of "Surfactant Component", when a perfluoroalkyl partial structure of a polymer and an oligomer contained in a surfactant are a perfluorobutyl partial structure (by addition of MEGAFACE R-40 (trade name) manufactured by Dainippon Ink and Chemicals Inc.), C4 was referred to. When the perfluoroalkyl partial structure is a perfluorooctyl partial structure (according to addition of MEGAFACE R-30 (trade name) manufactured by Dainippon Ink and Chemicals Inc.), C8 was referred to.

TABLE 2

| | Coating film resin | Surfactant component | Additive amount of surfactant | Height of edge reservoir |
|---|---|---|---|---|
| Example 1 | Coating film resin 1 | C4 | 0.01 g | 90 nm |
| Example 2 | Coating film resin 2 | C4 | 0.002 g | 40 nm |
| Example 3 | Coating film resin 3 | C4 | 0.005 g | 100 nm |
| Comparative Example 1 | Coating film resin 1 | C8 | 0.03 g | 90 nm |
| Comparative Example 2 | Coating film resin 2 | C8 | 0.004 g | 40 nm |
| Comparative Example 3 | Coating film resin 3 | C8 | 0.01 g | 100 nm |

As listed in Table 2, in Examples 1 to 3, in order to obtain the same effect (the height of the edge reservoir) in terms of the same composition as compared to Comparative Examples 1 to 3, the amount of the surfactant added was found to be ½ or less.

Namely, by the use of a surfactant containing a polymer and an oligomer having a perfluoroalkyl partial structure having a carbon number of 4, in order to obtain the same effect as compared to the case of using a surfactant containing a polymer and an oligomer having a perfluoroalkyl partial structure having a carbon number of 8, the additive amount may be ½ or less.

INDUSTRIAL APPLICABILITY

By the use of the film forming composition according to the present invention, a content of a surfactant causing sublimates in a heating process can be reduced to half or less. Accordingly, by the use of the composition according to the present invention, defects can be significantly reduced in a semiconductor device manufacturing process.

The invention claimed is:

1. A method, comprising:
applying a resist underlayer film-forming composition to a semiconductor substrate to form an underlayer film with a thickness of 0.11 μm to 3.0 μm on the semiconductor substrate, the resist underlayer film-forming composition comprising a surfactant containing a polymer having a $C_{3-5}$ perfluoroalkyl partial structure and an oligomer having a $C_{3-5}$ perfluoroalkyl partial structure;
forming a resist film on the underlayer film;
forming a resist pattern by irradiation with light, EUV, or an electron beam and development;
etching the underlayer film by use of the formed resist pattern; and
processing the semiconductor substrate by use of the patterned underlayer film, wherein the surfactant is contained in an amount of 0.0001% by mass to 1.5% by mass based on the total solid content of the film forming composition; and
the underlayer film is formed with reduced formation of an edge reservoir at a periphery of the underlayer film in which the edge reservoir causes an unnecessary residue that cannot be removed by an etching process relative a comparative underlayer film formed from the same components apart from the surfactant, which is a comparative surfactant that contains a polymer having a perfluoroalkyl partial structure, which is not a $C_{3-5}$ perfluoroalkyl partial structure, and an oligomer having a perfluoroalkyl partial structure, which is not a $C_{3-5}$ perfluoroalkyl partial structure.

2. The method according to claim 1, wherein the polymer having a $C_{3-5}$ perfluoroalkyl partial structure has a $C_4$ perfluoroalkyl partial structure, and the oligomer having a $C_{3-5}$ perfluoroalkyl partial structure has a $C_4$ perfluoroalkyl partial structure.

3. The method according to claim 1, wherein the resist overlayer film-forming composition further comprises a resin that has a weight average molecular weight of 600 to 200,000.

4. The method according to claim 3, wherein the resin is a novolac resin, a condensation epoxy resin, a (meth)acylic resin, a polyether-based resin, or a silicon-containing resin.

5. The method according to claim 3, wherein the resin is a polyether-based resin.

6. The method according to claim 3, wherein the resin is a condensation epoxy resin.

7. The method according to claim 3, wherein the resin is a silicon-containing resin.

8. A method, comprising:
applying a resist underlayer film-forming composition to a semiconductor substrate to form an underlayer film with a thickness of 0.11 μm to 3.0 μm on the semiconductor substrate, the resist underlayer film-forming composition comprising a surfactant containing a polymer having a $C_{3-5}$ perfluoroalkyl partial structure and an oligomer having a $C_{3-5}$ perfluoroalkyl partial structure;
forming a hard mask on the underlayer film;
forming a resist film on the hard mask;
forming a resist pattern by irradiation with light, EUV, or an electron beam and development;
etching the hard mask by use of the formed resist pattern;
etching the underlayer film by use of the patterned hard mask; and
processing the semiconductor substrate by use of the patterned underlayer film, wherein the surfactant is contained in an amount of 0.0001% by mass to 1.5% by mass based on the total solid content of the film forming composition; and
the underlayer film is formed with reduced formation of an edge reservoir at a periphery of the underlayer film in which the edge reservoir causes an unnecessary residue that cannot be removed by an etching process relative a comparative underlayer film formed from the same components apart from the surfactant, which is a comparative surfactant that contains a polymer having a perfluoroalkyl partial structure, which is not a $C_{3-5}$ perfluoroalkyl partial structure, and an oligomer having a perfluoroalkyl partial structure, which is not a $C_{3-5}$ perfluoroalkyl partial structure.

9. A method, comprising:
forming an organic underlayer film on the semiconductor substrate;
applying a resist underlayer film-forming composition onto the organic underlayer film and baking the composition to form a resist underlayer film with a thickness of 0.11 μm to 3.0 μm, wherein the resist underlayer film-forming composition comprises a surfactant containing a polymer having a $C_{3-5}$ perfluoroalkyl partial structure and an oligomer having a $C_{3-5}$ perfluoroalkyl partial structure;
applying a composition for a resist on the resist underlayer film to form a resist film;
exposing the resist film with light, EUV, or an electron beam;
developing the resist film after exposure to obtain a resist pattern;
etching the resist underlayer film by use of the resist pattern;
etching the organic underlayer film by use of the patterned resist underlayer film; and
processing the semiconductor substrate by use of the patterned organic underlayer film, wherein the surfactant is contained in an amount of 0.0001% by mass to 1.5% by mass based on the total solid content of the film forming composition; and
The resist underlayer film is formed with reduced formation of an edge reservoir at a periphery of the resist underlayer film in which the edge reservoir causes an unnecessary residue that cannot be removed by an etching process relative a comparative resist underlayer film formed from the same components apart from the surfactant, which is a comparative surfactant that contains a polymer having a perfluoroalkyl partial structure, which is not a $C_{3-5}$ perfluoroalkyl partial structure, and an oligomer having a perfluoroalkyl partial structure, which is not a $C_{3-5}$ perfluoroalkyl partial structure.

* * * * *